(12) United States Patent
Song

(10) Patent No.: US 6,639,956 B1
(45) Date of Patent: Oct. 28, 2003

(54) DATA RESYNCHRONIZATION CIRCUIT

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,978

(22) Filed: Dec. 31, 1999

(51) Int. Cl.[7] ............................................. H04L 7/00
(52) U.S. Cl. ...................... 375/354; 375/375; 375/372; 327/158; 710/61; 713/401
(58) Field of Search ............................ 375/375, 354, 375/372; 327/158; 710/61; 713/401

(56) References Cited

U.S. PATENT DOCUMENTS

| | | | | |
|---|---|---|---|---|
| 5,537,068 A | * | 7/1996 | Konno | 327/115 |
| 5,619,148 A | * | 4/1997 | Guo | 327/3 |
| 5,621,774 A | * | 4/1997 | Ishibashi et al. | 375/371 |
| 5,625,649 A | * | 4/1997 | Ishizu | 375/328 |
| 5,689,533 A | * | 11/1997 | Brauns et al. | 375/360 |
| 5,948,083 A | * | 9/1999 | Gervasi | 710/62 |

OTHER PUBLICATIONS

Yang et al ("A 0.8–um CMOS 2.5 Gb/s Oversampling Receiver and Transmiter for Serial Links", IEEE Journal of Solid–State Circuits, vol. 31, No. 12, Dec. 1996, pp 2015–2023).*

* cited by examiner

Primary Examiner—Stephen Chin
Assistant Examiner—Guillermo Munoz
(74) Attorney, Agent, or Firm—Blakely, Sokoloff, Taylor & Zafman LLP

(57) ABSTRACT

An apparatus comprising three sampling circuits to sample incoming data and a quarter clock. A clock generation unit is included to generate at least three sampling clocks from a local clock. Each of the three sampling clocks are configured to sample the incoming data and the quarter clock. A phase detector is also included to detect a phase difference between the quarter clock and the local clock and to generate a recovered quarter clock. A delay line is further included to delay the sampled incoming data and the recovered quarter clock by the detected phase difference.

21 Claims, 8 Drawing Sheets

DATA RESYNCHRONIZATION CIRCUIT

FIELD OF THE INVENTION

The invention relates to delay locked loop based circuits and in particular to delay locked loop based circuits for use with an IEEE 1394-1995 decoder, IEEE Std 1394-1995, published Aug. 30, 1996.

BACKGROUND

IEEE 1394-1995 decoders are based on a non return to zero (NRZ) transmission of data signal in which a strobe is also transmitted to recover the digital data from the NRZ data signal. From the NRZ data signal and the strobe, a recovery clock may be constructed which is used to extract the actual digital data from the NRZ data signal. The transmission of NRZ data signal and the strobe allows for a reliable transmission and receipt of digital data. During packet transmission, there is only a single node transmitting on the bus, so the entire media can operate in a half duplex mode using the two signals: Data and Strobe. As shown in FIG. 1, NRZ data is transmitted on Data and is accompanied by the Strobe signal which changes state whenever two consecutive NRZ data bits are the same, ensuring that a transition occurs on either Data or Strobe for each data bit. FIG. 2 illustrates an example of an IEEE 1394-1995 decoder 5. Decoder 5 receives the NRZ data signal and the strobe to generate a recovery clock using a plurality of flip flops 10, 15, and 20 to generate data data_1, data data_0 and a quarter clock qrt_clk, respectively. The three signals are then used to construct the original digital data transmitted by the source. A clock that transitions each bit period can be derived from the exclusive-or of Data with Strobe. The primary rationale for use of this transmission code is to improve the skew tolerance of information to be transferred across the serial bus.

However, the generated signals from the decoder are not useful because the recovered data and the recovered clock need to be in sync with the local clock of the circuit using the data. Generally, this function is performed by a data re-timing circuit. Previously, a phase locked loop (PLL) circuit was used for timing and carrier recovery to ensure optimal data sampling using a local clock. However, there are many disadvantages to using a PLL based circuit, in particular, in high speed and low power applications. For example, PLL based circuits require a long acquisition time, normally in the range of 100–2000 cycles before a "lock" takes place. In high speed circuits, such delay is not acceptable. To minimize the acquisition time, one previous method maintained a certain level of transition activity as to maintain a PLL lock. However, such transition activity generally resulted in power dissipation which in certain instances is undesirable.

Accordingly, there is a need for an IEEE 1394-1995 compatible resync circuit that is suitable for high speed low power applications and that has a relatively short acquisition time.

SUMMARY

In accordance with an embodiment of the invention, there is disclosed an apparatus including three sampling circuits to sample incoming data and a quarter clock. A clock generation unit is included to generate at least three sampling clocks from a local clock. Each of the three sampling clocks are configured to sample the incoming data and the quarter clock. A phase detector is also included to detect a phase difference between the quarter clock and the local clock and to generate a recovered quarter clock. A delay line is further included to delay the sampled incoming data and the recovered quarter clock by the detected phase difference.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve,to explain the principles of the invention. In the drawings.

DETAILED DESCRIPTION

In one aspect, the invention describes a technique to ensure safe data capture and resynchronization of serial data obtained from an IEEE 1394-1995 decoder to a local clock of a circuit using the data. In one embodiment, the invention uses a digital delay locked loop based circuit to adaptively adjust the optimal sampling position thereby re-synchronizing the incoming data with the local clock.

Figure 1:
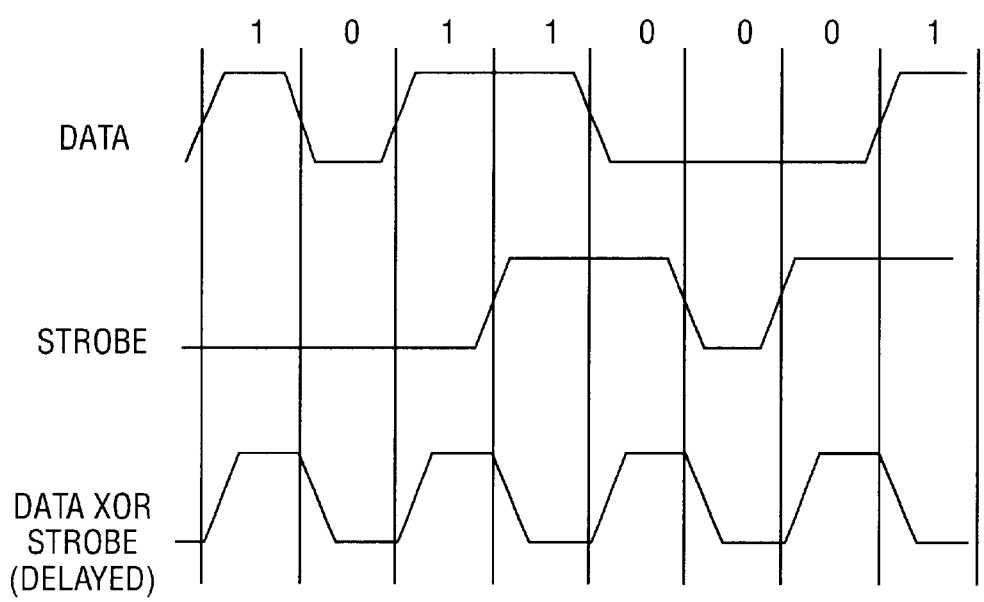
FIG. 1 illustrates a timing diagram for Data-Strobe decoding, that is, a clock that transitions each bit period derived from the exclusive-or of Data with Strobe, in accordance with an embodiment of the invention.
Figure 2:
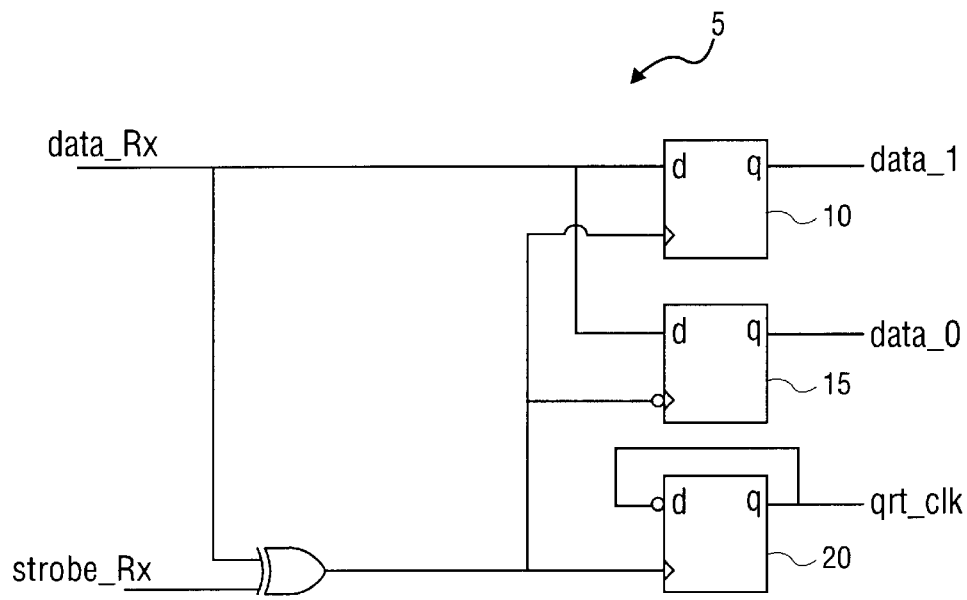
FIG. 2 is a schematic diagram of an IEEE 1394-1995 Decoder in accordance with an embodiment of the invention.
Figure 3:
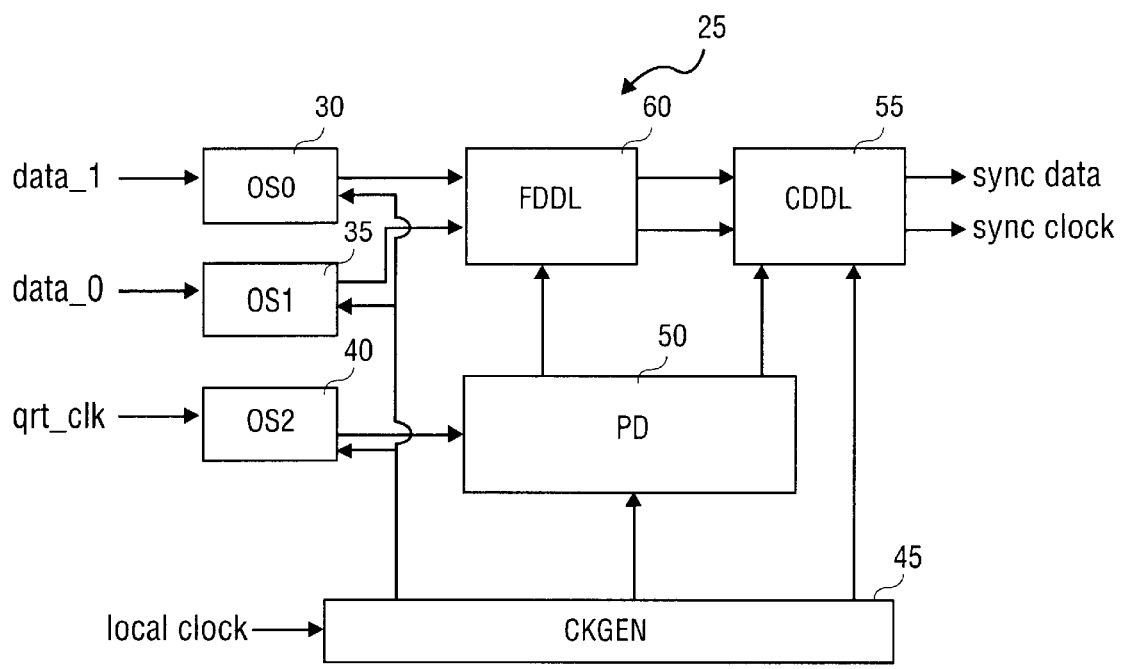
FIG. 3 is a schematic diagram of system comprising of a clock generation (CKGEN) unit, a fine digital delay line (FDDL) unit, a coarse digital delay line (CDDL) unit, a phase detector (PD) unit, and three over-sampler units (OS) units in accordance with an embodiment of the invention.
Figure 4:
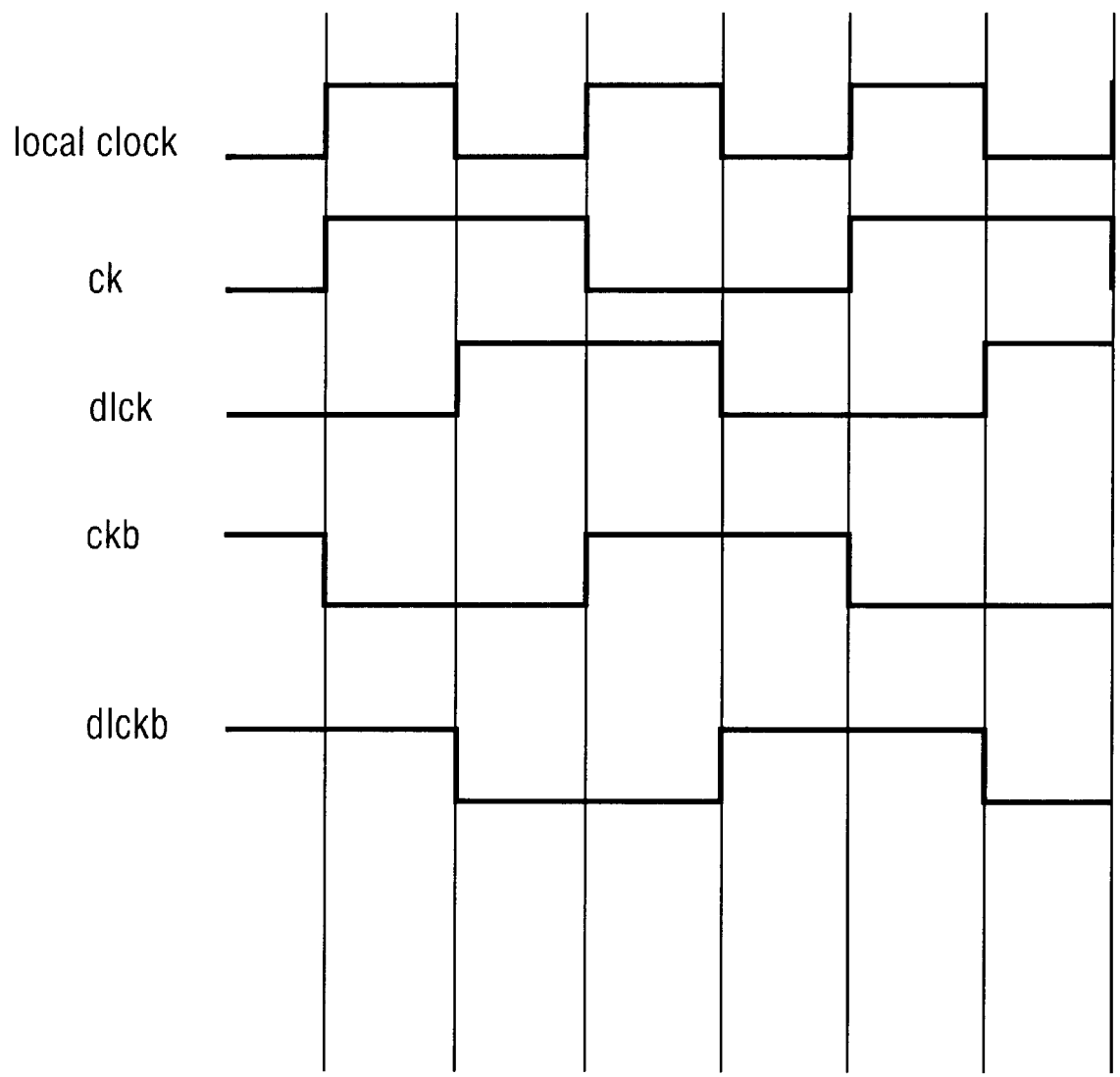
FIG. 4 is a schematic diagram of the CKGEN that divides the local clock by 2 to generate 4 equally spaced clocks, the rising edges of these clocks being used as time references to synchronize the operation of the entire system in accordance with an embodiment of the invention.

As shown in FIG. 3, a re-timing circuit 25 according to one embodiment of the invention, comprises three over-sampler units 30, 35, and 40, a clock generation (CKGEN) unit 45, a phase detector 50, a coarse digital delay line (CDDL) 55 and a fine digital delay line (FDDL) 60. Because a digital delay line is used to synchronize the incoming data with the lock clock, acquisition time of 4–10 cycles is possible thereby eliminating the need for transition activities as in a PLL circuit. Over-sampling unit 30 is used to over-sample data_1. Conversely, over-sampling unit 35 over-samples data_0 and over-sampling unit 40 over-samples the quarter clock. The over-sampling clocks are provided by CKGEN 45. CKGEN 45 receives the local clock and generates clocks ck, dlck, ckb, and dlckb. As shown in FIG. 4, the four equally spaced clocks are phase shifted by a quarter cycle with respect to each other. In one embodiment, CKGEN 45 generates the four clocks by dividing the local clock by two using a frequency divider (e.g., flip flop). The rising edge of the first clock, ck, is then made to synchronize with a rising edge of the local clock. The rising edge of the second clock, dlck, is synchronized with the immediate falling edge of the local clock. The third clock, ckb, may be generated by inverting the first clock, ck, and the fourth clock, dlckb, may be generated by inverting the second clock, dlck. CKGEN 45 may comprise flip flops and inverters to generate the four equally spaced clocks in the manner described above.

Figure 5:
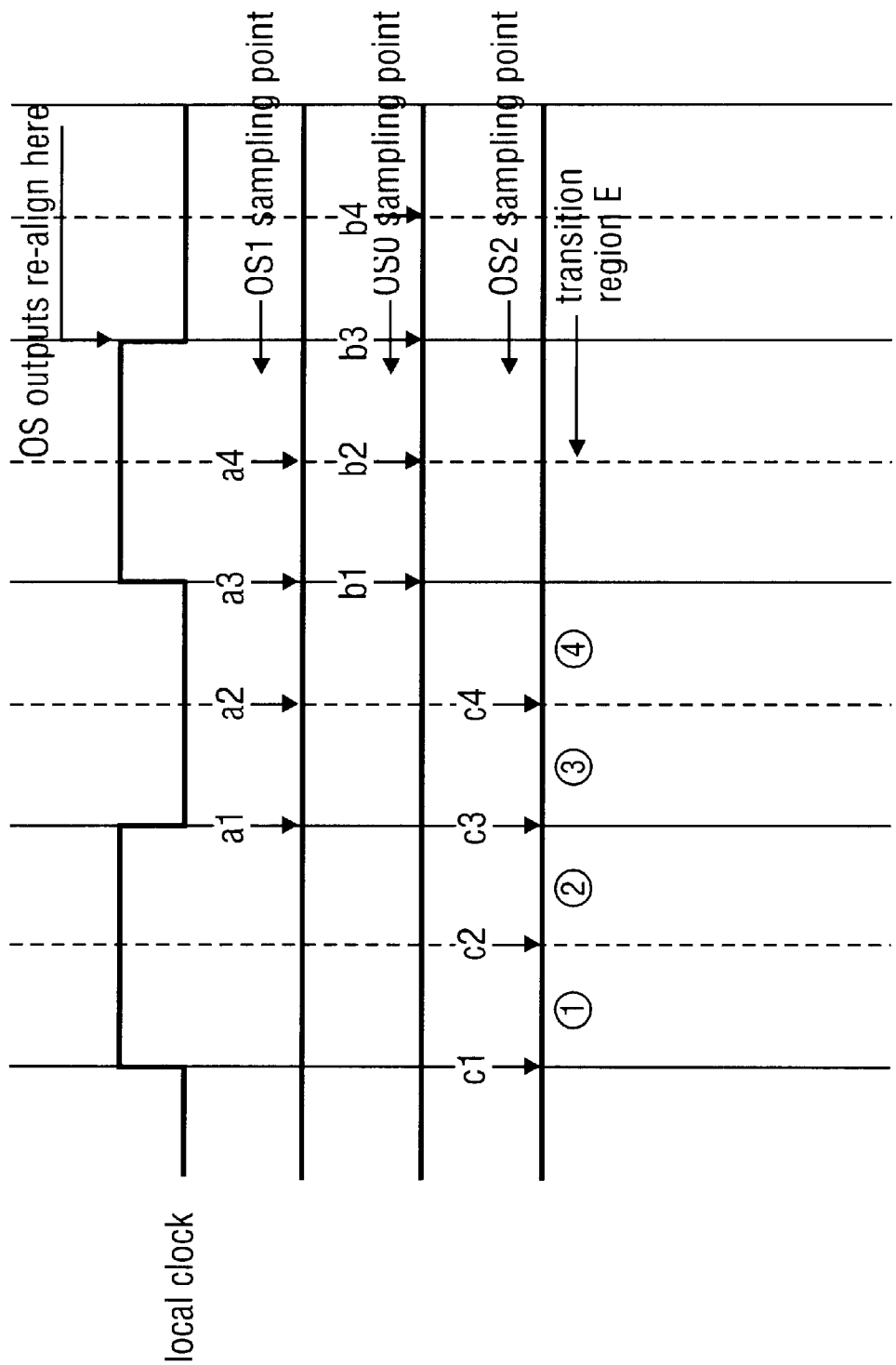
FIG. 5 illustrates OS sampling points and further decoding by the OS2 unit to determine the time location of the incoming data transition in accordance with an embodiment of the invention.

The generated four equally spaced clocks are used as sampling points to sample the data data_1, data data_0, and the quarter clock. Because the sampling points derive from the local clock, as will be apparent below, the sampled data is in sync with the local clock and suitable for processing by the receiving circuit. Although four sampling points are shown in FIG. 5, more sampling points may be used.

The sampling points of the over-sampling unit 40 are used to determine the phase difference between the quarter clock, qrt clk, and the local clock, clk. Assuming that only two sampling points are used, it would be difficult to determine if the quarter clock, qrt_clk, is leading or lagging the local clock. Using three or more sampling points, this determination is possible and is used by phase detector 50 to align the local clock with the quarter clock.

Figure 6:
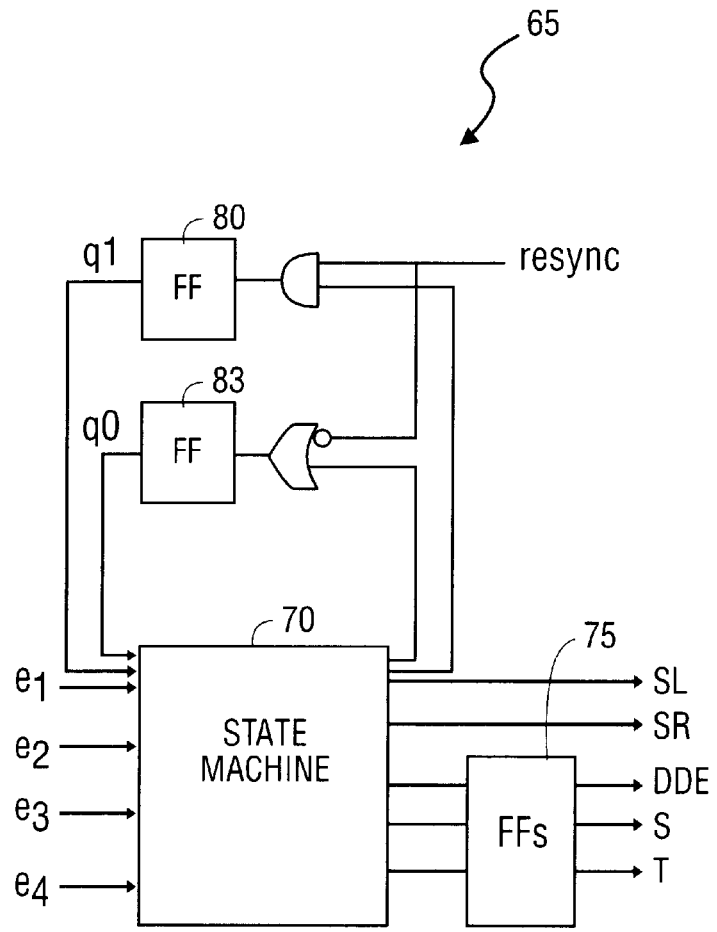
FIG. 6 illustrates a state machine that issues control signals to the delay lines based on the current system state and the incoming data transition location in accordance with an embodiment of the invention.
Figure 7:
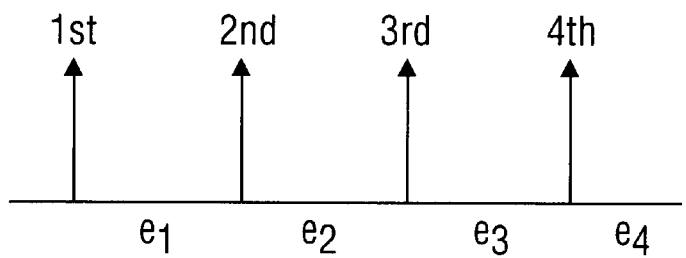
FIG. 7 illustrates region e1 which corresponds to the region between the first and second sampling points, e2 which corresponds to the region between the second and third sampling points, and so forth in accordance with an embodiment of the invention.

FIG. 6 is a phase detector 65 in accordance with one embodiment of the invention. At the core of phase detector 65, there is a four-state state machine 70 corresponding to the number of sampling points. Thus, if the number of sampling points is three, a three-state state machine would be used. The regions e1–e4 of the state machine are the sampled points of the over-sampling unit 40 which are further decoded to determine the phase transition of the quarter clock qrt_clk. As shown in FIG. 7, region e1 corresponds to the region between the first and second sampling points. Region e2 corresponds to the region between the second and third sampling points and so forth. As shown in FIG. 6, with the use of flip flops 80 and 83, q0 and q1, which represent data_0 and data_1 of the current state, are being input into four-state state machine 70 along with a receiving input from regions e1–e4. Thus, depending on the detected phase transition and the current state of machine 70, phase detector 65 will transmit various control signals. Control signals including shift left (SL), shift right (SR), and dual data enable (DDE) control the coarse digital delay line (CDDL). The single data select (S) and dual data select (T), which are obtained using a plurality of flip-flops 75, control the fine digital delay line (FDDL).

The operation of phase detector 65 is as follows: Assuming initially, a clock transition of the quarter clock qrt_clk occurs between the second and third sampling points, the region between the two will be decoded as e2 which is inputted into state machine 70. A data select (S) is transmitted to the fine digital delay line (FDDL) 85. As will be described further below, FDDL 85 controls the phase difference within the local clock cycle (in-cycle). Thus, if the phase error is more than one local clock cycle, coarse digital delay line (CDDL) 110 is used to compensate for the multi-local clock cycle phase difference. SL or SR signals are transmitted to CDDL 110 if the quarter clock transition occurs before region e1 or after region e4 respectively. Assuming that state machine 70 is at state 2, which reflects the inputted region e2, and the next sampling round shows that the quarter clock transition is occurring at region e1, this indicates that the quarter clock is leading. The state machine transmits the appropriate signals to FDDL 85 to compensate for the phase difference. State machine 70 appropriately updates its state to state 1 reflecting the inputted region e1. If a subsequent sampling round shows that the quarter clock transition is in region e4, then state machine 70 will recognize that the phase difference is multi-local clock cycle phase difference. Having detected a single data transition to FDDL 85, state machine 70 will transmit an SL signal to CDDL 110 and an S signal while updating the state machine to state 4.

Figure 8:
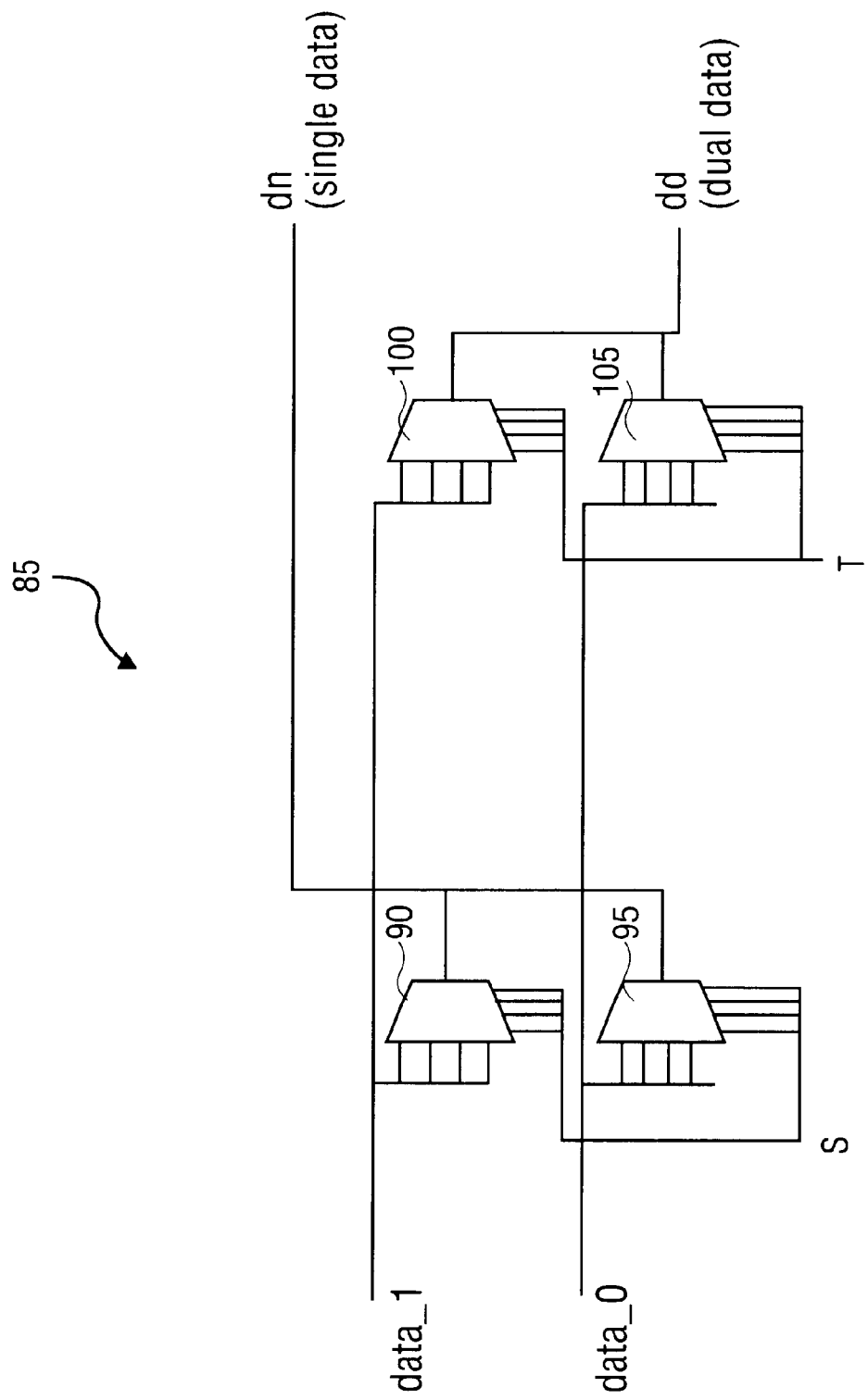
FIG. 8 is a schematic diagram of the FDDL unit comprising four 4-to-1 multiplexers used to select the optimal in-cycle delay data (dn) from the 4 delayed data of both data_0 and data_1 paths and a dual-data port (dd) used when two data transitions are detected in a single cycle in accordance with an embodiment of the invention.

FIG. 8 illustrates a fine digital delay line (FDDL) 85 in accordance with one embodiment of the invention. FDDL 85 comprises a crossbar structure of 4-to-1 multiplexers 90, 95, 100, and 105 to select the optimal in-cycle delay of data_0 and data_1. The operation is as follows: Assuming that signal e2 has been inputted into state machine 70, state machine 70 transmits an S signal to the second control line of multiplexers 90 and 95. This causes the second sampled data point of oversampling unit 30 and oversampling unit 35 which are in sync with the local clock, to be selected and passed through. In addition, a dual-data port (dd) is designed to cover the situation when two data transitions are detected in a single cycle. These multiplexers 90, 95, 100, and 105 are controlled by S and T signals from phase detector unit 65. Of course, this is but one embodiment of a delay line and other delay lines may be used to perform this function.

Figure 9:
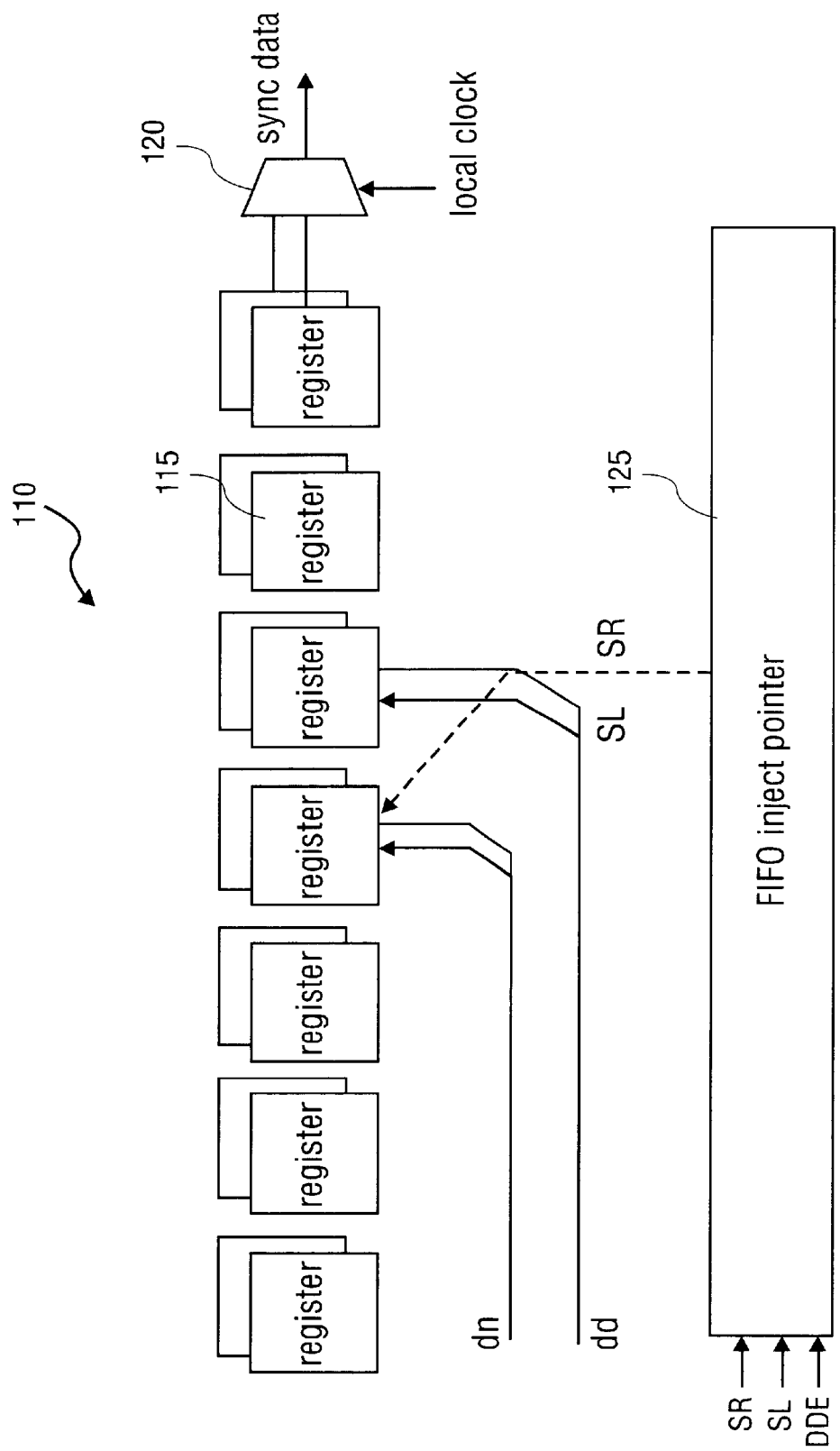
FIG. 9 is a schematic diagram of the CDDL unit comprising a multi-stage first-in first-out (FIFO) register array, where the outputs from the twin FIFO are combined into one using a multiplexer at the end of the FIFO in accordance with an embodiment of the invention.

FIG. 9 illustrates a coarse digital delay line (CDDL) 110 in accordance with an embodiment of the invention. CDDL 110 comprises a plurality of first-in first-out (FIFO) registers 115 where each register is equivalent to one local clock cycle delay. CDDL unit 110 comprises of a twin 7-stage first-in-first-out (FIFO) register array to cover a ±6 cycle delay adjustment range, in order to account for a possible 6 bit-error in the IEEE 1394-1995 decoder. The input-to-output delay adjustment of CDDL 110 is done through controlling the data injection pointer 125 along FIFO 115. Initially, the data injection pointer 125 is pre-set to the center of the FIFO array 115 and then adaptively controlled by the shift left (SL) and shift right (SR) signals from phase detector 65. The operation is as follows: Assuming phase detector 65 detects a clock transition in region e4 from the previous clock transition in region e1, phase detector 65 will recognize that the data transition is now occurring out of cycle. In this instance, state machine 70 in FIG. 6 transmits an S signal to the fourth control line of the multiplexers in FDDL 85 and also a shift-left (SL) signal to FIFO registers 115 of CDDL 110. On receipt of the SL signal, CDDL 110 shifts left one bit delaying the data by one cycle to compensate for one cycle lead of the quarter clock over the local clock. The design allows up to two sets of data (dn and dd)

to be injected into FIFO 115 simultaneously to cover non-, single-, and dual-data receiving in a single local clock cycle, as resulted from the time variation of the input data. Finally, the outputs from the twin FIFO 115 are combined into one using a multiplexer 120 at the end of FIFO 115 before sending out the sync data.

Figure 10:
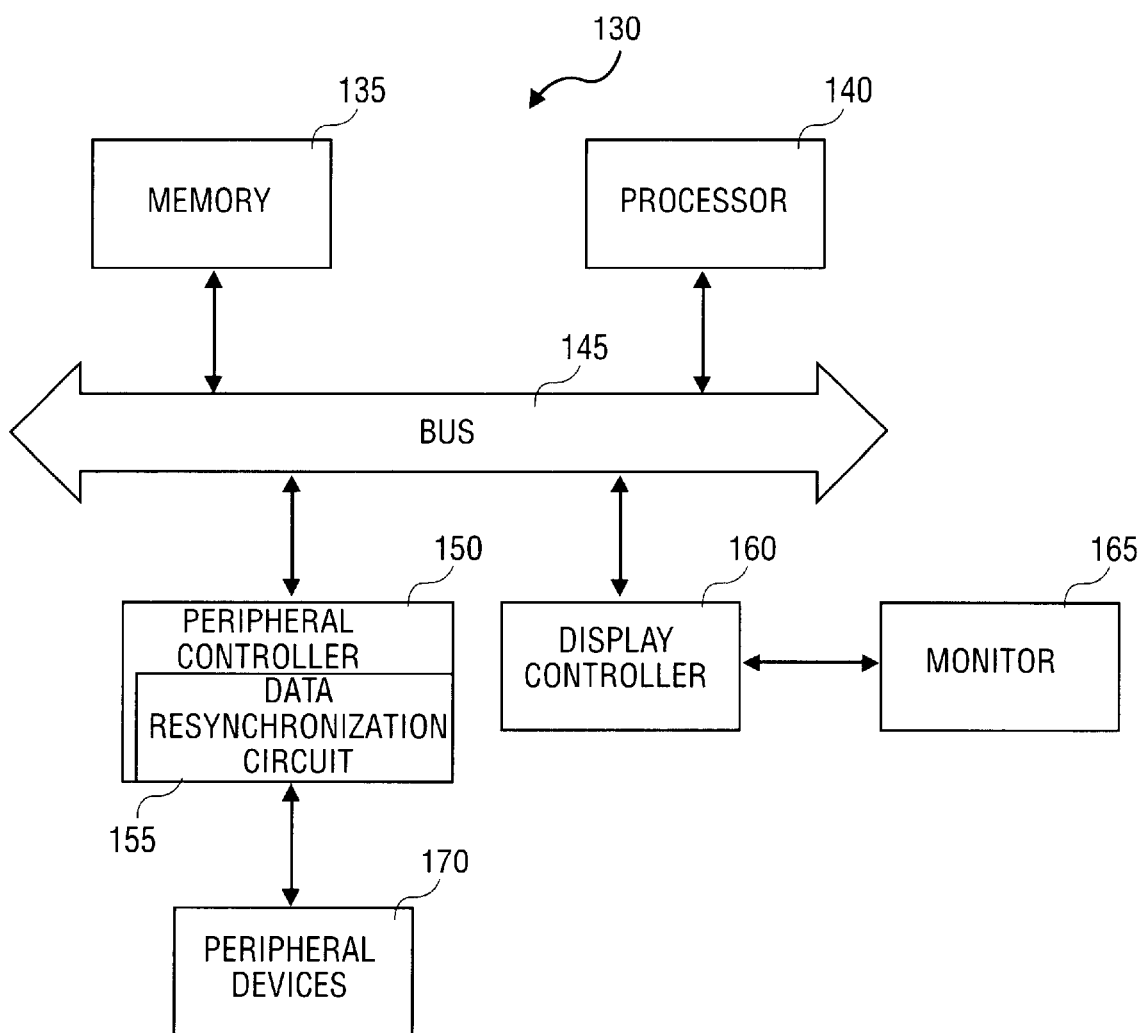
FIG. 10 is a schematic diagram of a peripheral controller comprising a data resynchronization circuit, and coupled to a processor that is adapted to access data from the peripheral controller.

FIG. 10 is a schematic diagram that illustrates a system 130 wherein a peripheral controller 150 comprises a data resynchronization circuit 155. Peripheral controller 150 is coupled to processor 140 via a serial or parallel bus 145. Processor 140 is adapted to access data from peripheral controller 140 via bus 145.

Memory 135, and display controller 160, may also be coupled to peripheral controller 150 via bus 145. Monitor 165 may also be coupled to display controller 160. Other peripheral devices 170, such as a mouse, CD-ROM and video, may also be coupled to peripheral controller 145.

FIG. 10 illustrates but one application of the invention, that is the personal computer, but may be used with other applications such as a work station, server, Internet driver or other fabric channels.

Compared to the analog delay locked-loop (DLL) synchronization approaches, the digital delay locked-loop (DLL) solution described in the invention is very suitable for system integration using advanced digital processes technology and design environment. Other advantages of this invention include: a full digital circuit implementation using highly reusable blocks for shorter development time, lower development cost, and higher manufacture yield; a twin-pipe (data_0 and data_1) architecture doubling the throughput of the data path and consequently allowing the core logic to operate at half of the core frequency; a scaleable architecture allowing extension of a locked-in range by simply increasing the delay line stage. Although the current circuit is implemented for IEEE 1394-1995 data communication, the technique described in this invention can also be used for most other data communication systems, such as a Community Access Television (CATV) network, the Public Switched Telephone Network (PSTN), the Integrated Services Digital Network (ISDN), the Internet, a local area network (LAN), a wide area network (WAN), over a wireless communications network, or over an asynchronous transfer mode (ATM) network.

In the foregoing specification, the invention has been described with reference to specific embodiments thereof. It will, however, be evident that various embodiments and changes can be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   at least two sampling circuits to sample incoming data and a first clock:
   a clock generation unit to generate a plurality of sampling clocks from a second clock, the plurality of sampling clocks used by the sampling circuits to sample the incoming data and the first clock;
   a phase detector to detect a phase difference between the first clock and the second clock; and
   a delay line to delay the sampled incoming data based on the detected phase difference, wherein the delay line delays the sampled incoming data by selecting one of sampled data points of the sampled incoming data,
   wherein the phase detector comprises a state machine that issues control signals to the delay line based on the current state of the state machine and a receiving input from a plurality of sample points of one of the sampling circuits.

2. An apparatus comprising:
   at least two sampling circuits to sample incoming data and a first clock;
   a clock generation unit to generate a plurality of sampling clocks from a second clock, the plurality of sampling clocks used by the sampling circuits to sample the incoming data and the first clock;
   a phase detector to detect a phase difference between the first clock and the second clock; and
   a delay line to delay the sampled incoming data based on the detected phase difference, wherein the delay line delays the sampled incoming data by selecting one of sampled data points of the sampled incoming data,
   wherein a first sampling circuit of the at least two sampling circuits is an oversampling circuit to oversample incoming data captured by a clock rising edge,
   a second sampling circuit of the at least two sampling circuits is an oversampling circuit to oversample incoming data captured by a clock falling edge, and
   a third sampling circuit of the at least two sampling circuits is an oversampling circuit to oversample the first clock.

3. An apparatus comprising:
   at least two sampling circuits to sample incoming data and a first clock;
   a clock generation unit to generate a plurality of sampling clocks from a second clock, the plurality of sampling clocks used by the sampling circuits to sample the incoming data and the first clock;
   a phase detector to detect a phase difference between the first clock and the second clock; and
   a delay line to delay the sampled incoming data based on the detected phase difference, wherein the delay line delays the sampled incoming data by selecting one of sampled data points of the sampled incoming data,
   wherein the delay line comprises a fine digital delay line and a coarse digital delay line.

4. The apparatus of claim 3, wherein the fine digital delay line comprises a plurality of multiplexers to select an in-cycle delay of the sampled data.

5. The apparatus of claim 3, wherein the coarse digital delay line comprises a plurality of first-in-first-out registers where each register delays the in-cycle delay of the sampled data by one clock cycle of the second clock.

6. The apparatus of claim 3, wherein the control signals transmitted by the phase detector include a shift-left, a shift-right, dual data enable to control the coarse digital delay line and a single data select representing a single phase transition in a clock cycle, a dual data select representing a dual phase transition in a clock cycle to control the fine digital delay line.

7. The apparatus of claim 5, wherein an input-to-output delay adjustment of the coarse digital delay line further comprises controlling a data injection pointer and then adaptively controlled by the shift-left and shift-right signals from the phase detector to a second of the plurality of FIFO registers.

8. A method of data resynchronization comprising:
   (a) sampling incoming data and a first clock;
   (b) generating at least three sampling clocks from a second clock, each of the three sampling clocks to sample the incoming data and the first clock;

(c) detecting a phase difference between the first clock and the second clock; and (d) delaying the sampled incoming data based on the detected phase difference by selecting one of sampled data points of the sampled incoming data, repeating (a) through (d) a plurality of times, wherein sampling a first time comprises oversampling incoming data captured by a clock rising edge;

sampling a second time comprises oversampling incoming data captured by a clock falling edge; and sampling a third time comprises oversampling the first clock.

9. The method of claim 8, wherein generating the at least three sampling clocks comprises:

synchronizing a rising edge of a first sampling clock with a rising edge of the second clock;

synchronizing a rising edge of a second sampling clock with the immediate falling edge of the second clock;

generating a third sampling clock by inverting the first clock; and generating a fourth sampling clock by inverting the second clock.

10. A method of data resynchronization comprising:

(a) sampling incoming data and a first clock;

(b) generating at least three sampling clocks from a second clock, each of the three sampling clocks to sample the incoming data and the first clock;

(c) detecting a phase difference between the first clock and the second clock; and (d) delaying the sampled incoming data based on the detected phase difference by selecting one of sampled data points of the sampled incoming data, wherein delaying comprises fine digital delaying and coarse digital delaying.

11. The method of claim 10, wherein fine digital delaying comprises configuring a plurality of multiplexers to select an optional in-cycle delay of the sampled data.

12. The method of claim 10, wherein coarse digital delaying comprises configuring a plurality of first-in-first-out (FIFO) registers to delay the in-cycle delay of the sampled data by one clock cycle of the second clock.

13. The method of claim 10, wherein transmitting control signals by the phase detector include shifting data left, shifting data right, enabling dual data to control the coarse digital delay line and selecting single data representing a single phase transition in a clock cycle, selecting dual data representing a dual phase transition in a clock cycle, to control the fine digital delay line.

14. The method of claim 12, wherein delaying by the coarse digital delay line further comprises controlling a data injection pointer, which is initially pre-set to a first of the plurality of first-in-first-out registers and then adaptively controlled by the shift-left and shift-right signals from the phase detector to a second of the plurality of first-in-first-out registers.

15. A system comprising:

a processor; and a peripheral controller coupled to the processor, the processor adapted to access data from the peripheral controller, the peripheral controller comprising:

a decoder to receive data signal and strobe signal and generate a first data signal, a second data signal and a recovered clock signal;

a first sampling circuit to oversample the first data signal generated by the decoder;

a second sampling circuit to oversample the second data signal generated by the decoder; and a third sampling circuit to oversample the recovered clock signal generated by the decoder;

a clock generation unit to generate at least three sampling clocks from a local clock, each of the three sampling clocks used by the sampling circuits to sample the first and second data signals and the recovered clock signal;

a phase detector to detect a phase difference between the recovered clock signal and the local clock; and a delay line to delay the sampled data signals based on the detected phase difference, wherein the delay line delays the sampled incoming data by selecting one of sampled data points of the sampled incoming data.

16. The system of claim 15, wherein the phase detector comprises a state machine that issues control signals to the delay lines based on the current state of the state machine and a receiving input from the sampled points of one of the sampling circuits.

17. The system of claim 15, wherein the delay line comprises a fine digital delay line and a coarse digital delay line.

18. The system of claim 17, wherein the fine digital delay line comprises a plurality of multiplexers to select an optimal in-cycle delay of the sampled data.

19. The system of claim 17, wherein the coarse digital delay line comprises a plurality of first-in-first-out registers where each register delays the optimal in-cycle delay of the sampled data by one local clock cycle.

20. The system of claim 17, wherein the control signals transmitted by the phase detector include a shift-left, a shift-right, dual data enable to control the coarse digital delay line and a single data select representing a single phase transition in a clock cycle, a dual data select representing a dual phase transition in a clock cycle to control the fine digital delay line.

21. The system of claim 19, wherein delaying by the coarse digital delay line further comprises controlling a data injection pointer, which is initially pre-set to a first of the plurality of first-in-first-out registers and then adaptively controlled by the shift-left and shift-right signals from the phase detector to a second of the plurality of first-in-first-out registers.

* * * * *